(12) United States Patent
Torres et al.

(10) Patent No.: US 7,630,191 B2
(45) Date of Patent: Dec. 8, 2009

(54) MIM CAPACITOR

(75) Inventors: Joaquin Torres, Saint Martin le Vinoux (FR); Sonarith Chhun, Eindhoven (NL); Laurent-Georges Gosset, Eindhoven (NL)

(73) Assignee: STMicroelectronics Crolles 2 SAS, Crolles (FR)

( * ) Notice: Subject to any disclaimer, the term of this patent is extended or adjusted under 35 U.S.C. 154(b) by 221 days.

(21) Appl. No.: 11/706,059

(22) Filed: Feb. 13, 2007

(65) Prior Publication Data
US 2007/0200197 A1  Aug. 30, 2007

(30) Foreign Application Priority Data
Feb. 15, 2006 (FR) .................................. 06 50540

(51) Int. Cl.
*H01G 4/06* (2006.01)
(52) U.S. Cl. .............. 361/321.4; 361/321.1; 361/321.2; 361/311; 361/313; 361/303

(58) Field of Classification Search .............. 361/321.4, 361/321.1, 321.2, 311–313, 306.2, 301.4, 361/303–305, 306.1, 306.3; 257/787–788
See application file for complete search history.

(56) References Cited

U.S. PATENT DOCUMENTS

| 5,976,928 | A  | * | 11/1999 | Kirlin et al. .................. 438/240 |
| 6,187,624 | B1 | * | 2/2001  | Huang ......................... 438/253 |
| 6,346,741 | B1 | * | 2/2002  | Van Buskirk et al. ....... 257/664 |
| 6,548,348 | B1 |   | 4/2003  | Ni et al. |
| 6,563,190 | B1 | * | 5/2003  | Lee et al. ..................... 257/532 |
| 7,052,967 | B2 | * | 5/2006  | Lee et al. ..................... 438/396 |
| 2004/0115954 | A1 |  | 6/2004 | Todd |

FOREIGN PATENT DOCUMENTS

GB  2262186 A  6/1993

OTHER PUBLICATIONS

French Search Report from French Patent Application 06/50540, filed Feb. 15, 2006.

* cited by examiner

*Primary Examiner*—Nguyen T Ha
(74) *Attorney, Agent, or Firm*—Lisa K. Jorgenson; James H. Morris; Wolf, Greenfield & Sacks, P.C.

(57) ABSTRACT

A capacitor formed in an insulating porous material.

15 Claims, 3 Drawing Sheets

MIM CAPACITOR

BACKGROUND OF THE INVENTION

1. Field of the Invention

The present invention relates to the manufacturing of semiconductor circuits. More specifically, the present invention relates to the structure and to the manufacturing of capacitors of metal-insulator-metal type (MIM) formed in metallization levels of interconnection of semiconductor circuits.

2. Discussion of the Related Art

MIM capacitors formed in metallization levels of interconnection of semiconductor circuits are used in a great number of applications. For example, such capacitors are used as decoupling capacitors, or as filters, for example, between two circuits or components, or in voltage-controlled oscillators or else in radio-frequency applications, or else as all or part of memory elements, for example in DRAMs . . .

FIG. 1 illustrates in cross-section view a known MIM capacitor.

The capacitor is obtained by forming, in an interlevel dielectric ILD, a first electrode E1 of the capacitor. Electrode E1 is generally formed of a line L having its bottom and its lateral walls separated from peripheral dielectric ILD by a thin layer 3 of a bonding/barrier material.

To complete the capacitor, an opening in which are successively deposited a thin insulating layer 7 and a thin layer 8 of a bonding/barrier layer, the remaining opening being filled by means of a conductor V, is formed in an interlevel dielectric IMD superposed to dielectric ILD and to line L. Insulating layer 7, barrier layer 8, and filling conductor V are removed from the upper surface of dielectric IMD. A second electrode E2 of the capacitor formed of barrier layer 8 and of conductor V and separated from the first underlying electrode E1 by insulator 7 is thus obtained.

Interlevel dielectrics ILD and IMD are generally made of silicon oxide ($SiO_2$). Bonding layer 3 is made of tantalum (Ta), titanium (Ti), tantalum nitride (TaN), titanium nitride (TiN), or a multiple-layer of at least two of these conductors. Line L and conductor V are generally made of copper. Dielectrics ILD and IMD are then generally separated by a copper passivation insulating layer 10 open at the same time as dielectric IMD before the depositions of interelectrode insulator 7 and of second electrode E2.

Capacitance C of the capacitor thus obtained is proportional to electric permittivity $\in$ of interelectrode insulator 7 and to surface area S opposite to electrodes E1 and E2 and inversely proportional to thickness e of insulator 7 ($C=\in S/e$).

To increase the value of capacitance C, it has been desired to decrease the value of thickness e. However, such a decrease comes against various limits. Especially, a limit lies in the constraint of having an interelectrode insulator 7 of homogeneous thickness. Further, a decrease in thickness e comes along with a decrease in the breakdown voltage of insulator 7. The decrease in thickness e is thus limited by the voltage difference that appears between electrodes E1 and E2. Further, a decrease in thickness e comes along with an increase in the malfunctions linked to the leakage currents.

Insulators with a significant permittivity $\in$ such as, for example, hafnium oxide ($HfO_2$, $\in=18$), tantalum oxide ($Ta_2O_5$, $\in=26$), or zirconium oxide ($\in=22$ to 25 according to the stoichiometry) or more complex oxides such as ceramics having very high permittivities, that is, greater than 100, that may reach and exceed 3,000, may also be used. However, the use of such materials with a significant permittivity $\in$ raises manufacturing problems. Indeed, insulator 7 is deposited while semiconductor components, not shown, are already present in an underlying substrate. A problem lies in the fact that the deposition conditions of materials with a significant permittivity $\in$ are sometimes incompatible with the presence of the components. Another problem lies in the fact that materials with a significant permittivity $\in$ may be deteriorated by the subsequent component manufacturing steps, in particular by the thermal cycles. Another problem lies in the fact that it is complex to obtain a thin homogeneous layer of a material with a significant permittivity $\in$ which is not polluted by contaminants which lower its real permittivity in an uncontrolled and variable fashion.

It has also been desired to increase capacitance C of the capacitor by increasing its surface area S. For this purpose, various structures have been provided to increase first electrode E1 across thickness h of interlevel dielectric ILD. Thus, a currently-used solution includes the deposition of a thin metal layer, generally of the same nature as bonding layer 3 and 8, before deposition of interelectrode insulator 7. This enables increasing electrode E1 opposite to the vertical walls of electrode E2. However, such an increase in surface area S in dielectric ILMi comes across various limits. Especially, the increasing desire to reduce the dimensions and costs of semiconductor devices results in a decrease in the thicknesses of the metallization levels. The need to increase surface area S in dielectric IMD then comes against the need to decrease its thickness h. It has then been provided to give the capacitor complex shapes aiming at increasing surface area S in dielectric IMD not only in the vertical direction, but also along the horizontal direction. However, horizontal increases come once again against the decrease in dimensions. Further, methods of conformal deposition of thin metal layers according to complex contours are relatively difficult and expensive to implement. In comparison with the improvements of the obtained electric performance, such solutions are considered as too expensive. The forming of the MIM capacitors thus becomes a major obstacle to the decrease in the dimensions of the semiconductor circuits forming them.

SUMMARY OF THE INVENTION present invention aims at providing a capacitor structure which overcomes all or part of the disadvantages of known MIM capacitors.

The present invention aims at providing such a capacitor which exhibits a high capacitance.

The present invention aims at providing such a capacitor which exhibits decreased integration dimensions.

The present invention aims at providing such a capacitor which is not an obstacle to decreasing the thickness of the interconnect metallization level in which it is formed.

The present invention also aims at providing a method for manufacturing such a capacitor which overcomes all or part of the disadvantages of known MIM capacitor manufacturing methods.

The present invention aims at providing such a method which is relatively simple and inexpensive to implement in comparison with the improvements obtained in terms of the electric performance of the capacitor as well as in terms of integration surface area.

To achieve all or part of these objects, the present invention provides a capacitor formed in an insulating porous material.

According to an embodiment of the present invention, the insulating porous material exhibits a homogeneous porosity ranging between approximately 20% and 40%, the pores of the material having openings from approximately 20 nm to 30 nm.

According to an embodiment of the present invention, the insulating porous material is SiOCH.

According to an embodiment of the present invention, the insulating insulating porous material is porous silicon oxide.

The present invention also provides a method for forming a capacitor, in which the capacitor is formed in a layer of an insulating porous material.

According to an embodiment of the present invention, the insulating porous material exhibits a homogeneous porosity ranging between approximately 20% and 40%, the pores of the material having openings of a diameter from approximately 15 nm to 30 nm.

According to an embodiment of the present invention, the insulating porous material is porous silicon oxide or SiOCH.

According to an embodiment of the present invention, the method comprises the steps of:

forming an insulating porous material layer;

depositing on and inside of the insulating porous material a first conductive layer;

depositing on the conductive layer an insulating layer; and depositing on the insulating layer at least a second conductive layer, the first conductive layer and the insulating layer being thin layers of a thickness such that their sum is smaller than the diameter of the pores of the insulating porous material.

According to an embodiment of the present invention, the layer of the insulating porous material is deposited on a conductive line.

According to an embodiment of the present invention, the second conductive layer is formed of a thin metallic sub-layer deposited on the insulating layer and of a thick metallic layer deposited on the sub-layer.

The foregoing and other objects, features, and advantages of the present invention will be discussed in detail in the following non-limiting description of specific embodiments in connection with the accompanying drawings.

DETAILED DESCRIPTION

Figure 1:
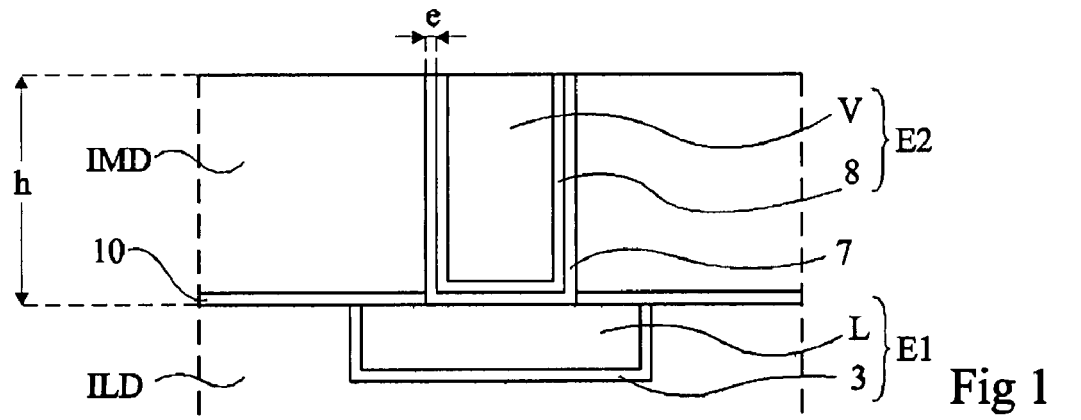
FIG. 1, previously described, illustrates, in a cross-sectional view, a known MIM capacitor.

For clarity, the same elements have been designated with the same reference numerals in the different drawings. Further, as usual in the representation of semiconductor circuits, the various drawings are not to scale.

FIGS. 2A to 2E illustrate, in a cross-sectional view, different steps of the forming of a capacitor in interconnect metallization levels of a semiconductor circuit according to an embodiment of the present invention.

Figure 2A:
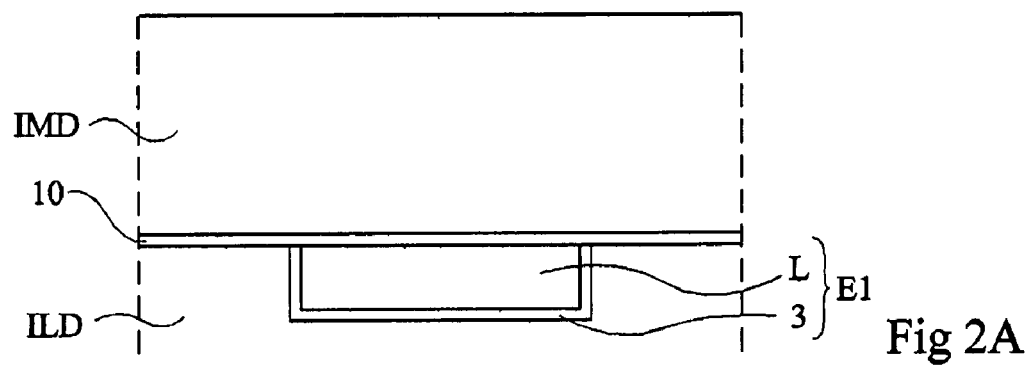
FIGS. 2A to 2F illustrate, in a cross-sectional view, different steps of the forming of a capacitor according to an embodiment of the present invention.

As illustrated in FIG. 2A, the method starts from a semiconductor circuit in which at least one interconnect metallization level is already formed. For example, a conductive line L is formed in a thick dielectric ILD. The bottom and the lateral walls of line L are preferably separated from dielectric ILD by a barrier layer 3 and a passivation layer 10 covers at least the upper surface of line L. Barrier layer 3 and passivation layer 10 are made of materials capable of avoiding the diffusion of the metal of line L. For example, line L is made of copper, barrier layer 3 is a Ta/TaN or Ti/TiN multiple-layer, and passivation layer 10 is a silicon nitride layer $Si_3N_4$ extending over the coplanar upper surfaces of dielectric ILD and of line L. The method carries on with the deposition, on layer 10, of an interlevel dielectric IMD. For example, dielectric IMD is a silicon oxide layer of a thickness ranging between 0.1 and 1 µm.

Figure 2B:
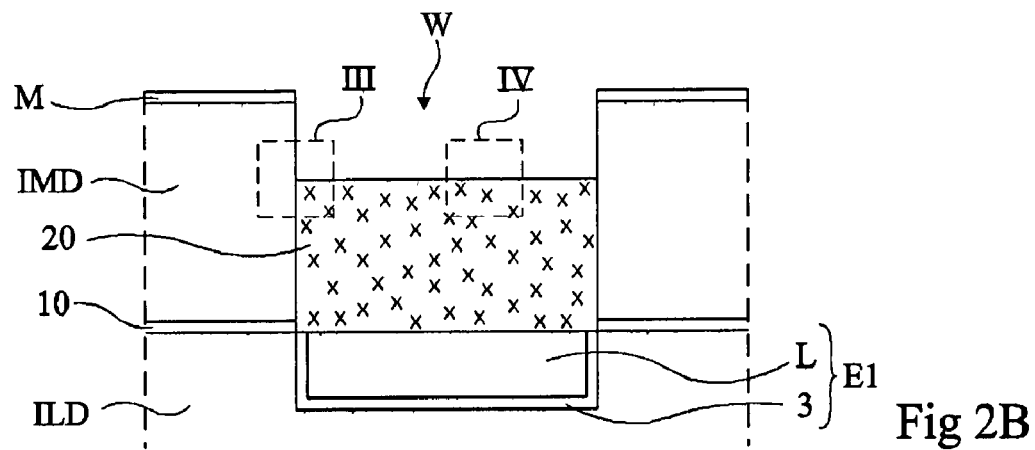

Then, as illustrated in FIG. 2B, dielectric IMD and passivation layer 10 are locally opened to at least partially expose the upper surface of line L. For this purpose, a resin mask M formed on dielectric IMD is used. Preferably, mask M is maintained in place after the forming of an opening W. A layer 20 of an insulating porous material is deposited at the bottom of opening W. Layer 20 is deposited to avoid completely filling opening W. The insulating porous material forming layer 20 exhibits a porosity from approximately 20% to 40%, the pore dimensions being substantially homogeneous. Further, the pores are interconnected to enable flowing of a fluid from the upper surface of layer 20 to its lower surface in contact with line L.

According to an embodiment, the pores of the insulating porous material forming layer 20 have a diameter ranging from 15 to 30 nm. For example, layer 20 is made of porous silicon oxide ($SiO_2$) or of a carbonated silicon oxide compound of formula SiOCH deposited by chemical vapor deposition (CVD) or spin-on deposition.

Figure 3D:
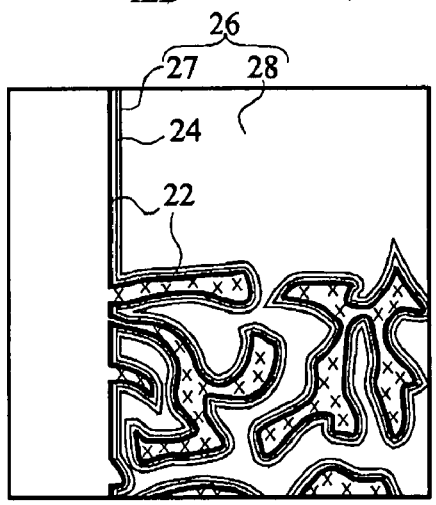
FIGS. 3A to 3D illustrate, in a cross-sectional view, local enlargements of a first location of FIGS. 2B to 2F, respectively.
Figure 4D:
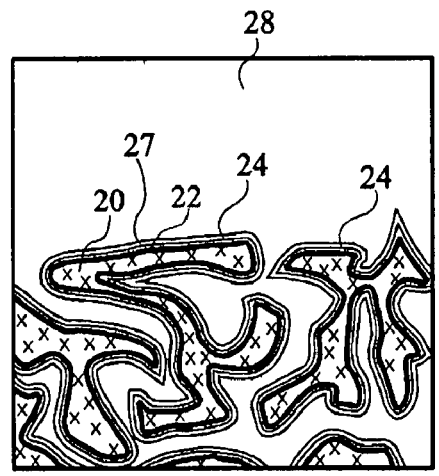
FIGS. 4A to 4D illustrate, in a cross-sectional view, local enlargements of a second location of FIGS. 2B to 2E, respectively.
Figure 3A:
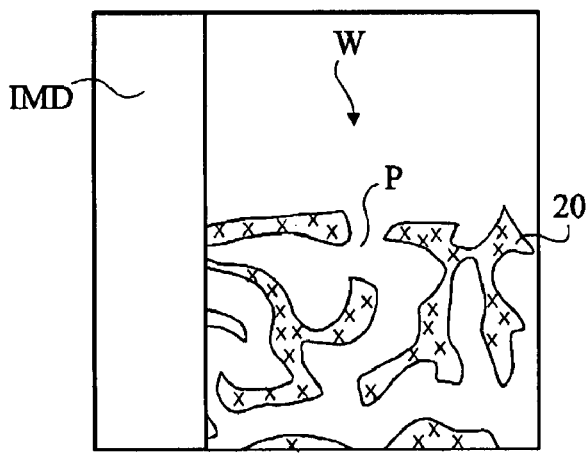
Figure 4A:
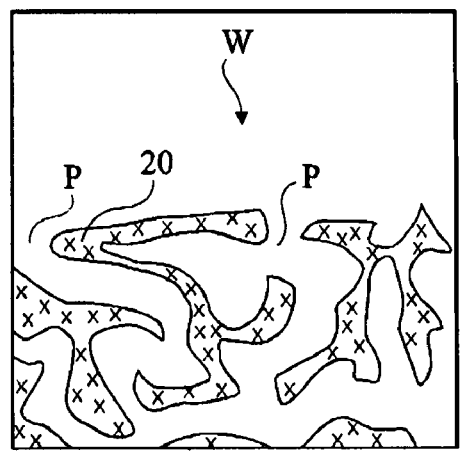

FIGS. 3A and 4A illustrate enlargements of the structure of the surface of layer 20 at the level of locations III and IV, respectively, surrounded with dotted lines in FIG. 2B. Location 3A is located on the edge of opening W. Location 4A is distant from the walls of openings W. FIGS. 3A and 4A illustrate pores P of the insulating porous material forming layer 20.

Figure 2C:
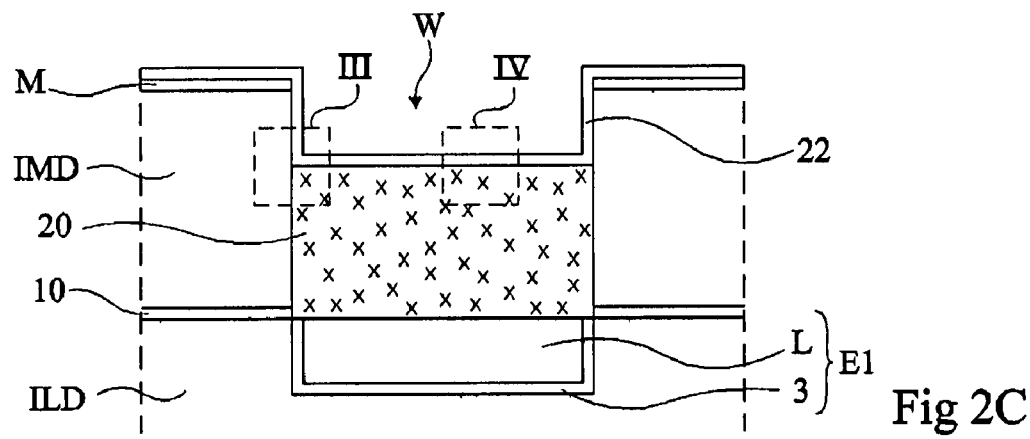
Figure 2D:
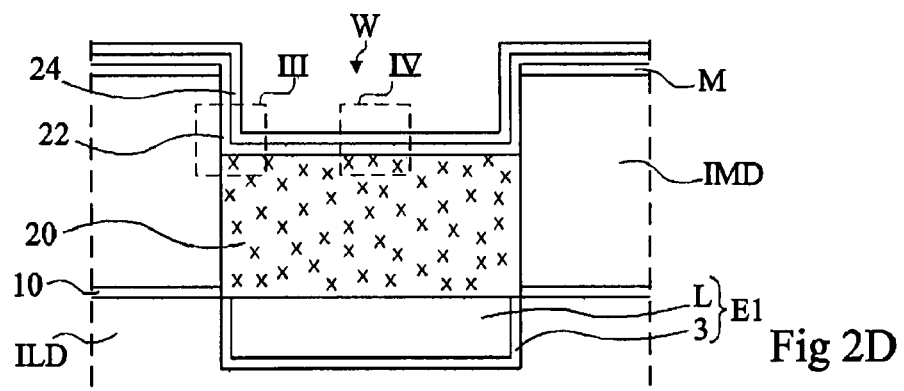
Figure 2E:
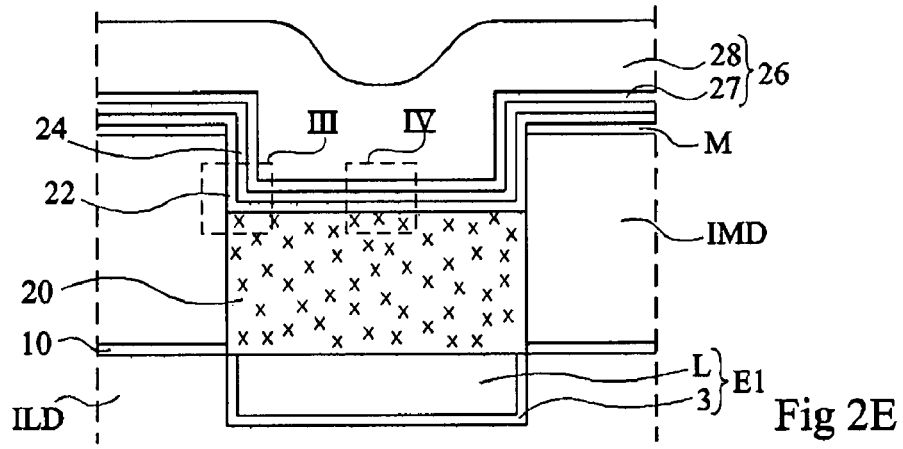
Figure 3B:
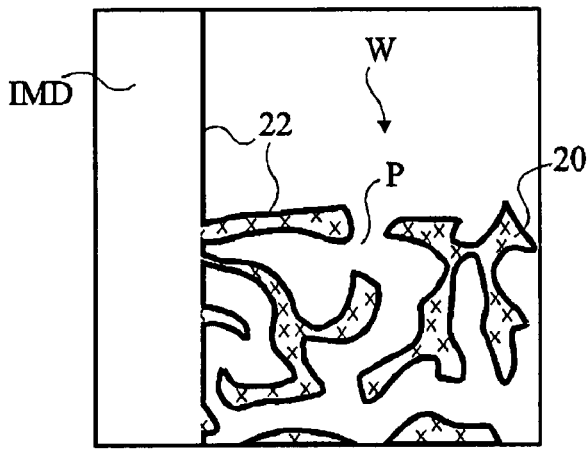
Figure 3C:
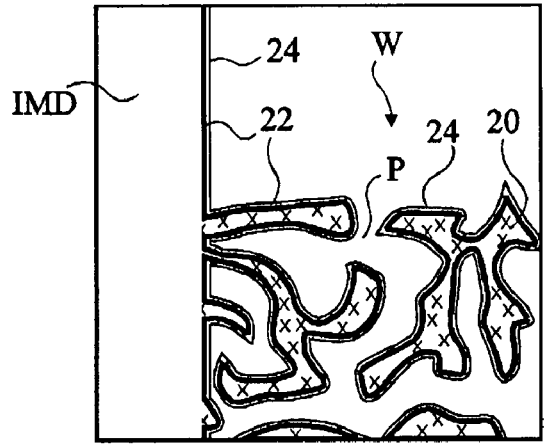

FIGS. 3B to 3D are enlargements of the surface of layer 20 at the same location III as FIG. 2B performed respectively at the surface of FIGS. 2C to 2E. Similarly, FIGS. 4B to 4D are enlargements of FIGS. 2C to 2E performed at the same location IV of the surface of layer 20 as FIG. 2B.

Figure 4B:
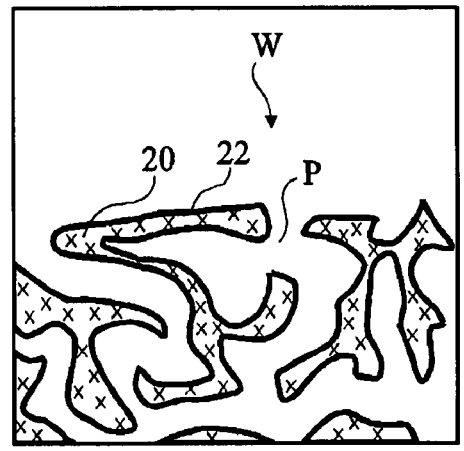

At the next steps, illustrated in FIGS. 2C, 3B, and 4B, a thin metal layer 22 is deposited in opening W. The thickness and the deposition mode of layer 22 are selected to penetrate into pores P without filling them nor obturating them. For example, layer 22 is a tungsten (W), titanium, ruthenium (Ru), or tantalum nitride layer (TaN) of a non-null thickness lower than 5 nm, preferably lower than 3 nm. Layer 22 is deposited in vapor phase by the atomic layer deposition method known as ALD. In such a deposition, the material intended to form layer 22 being in vapor phase can infiltrate and deposit in all pores P of layer 20. Further, due to the interconnection of pores P, the vapor flows to line L on which it also deposits. There then is an electric continuity between layer 22 and line L. It should be noted that layer 22 also deposits on the free walls of opening W, inside of layer 22 as well as above, as well as on mask M. Layer 22 in contact with line L is intended to form a first electrode of the capacitor.

Figure 4C:
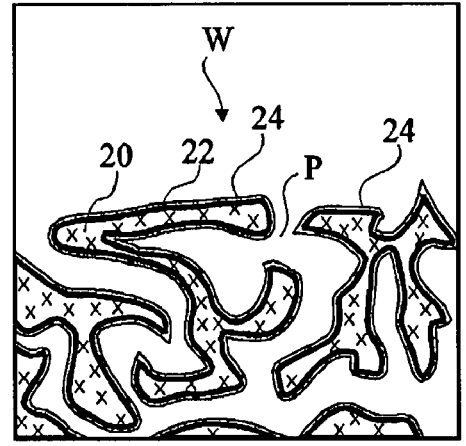

Then, as illustrated in FIGS. 2D, 3C, and 4C, a thin insulating layer 24 is deposited. Layer 24 is made of an insulating material having significant electric permittivity, capable of being deposited in vapor phase. Layer 24 is homogeneously deposited over the entire layer 22, especially in pores P, along the walls of openings W and above mask M. Layer 24 is, for example, an $HfO_2$, $Ta_2O_5$, $TiO_2$, or $ZrO_2$ layer deposited by ALD with a thickness lower than 5 nm, preferably lower than 3 nm. Layer 24 is intended to form the interelectrode insulator of the capacitor.

Then, as illustrated in FIGS. 2E, 3D, and 4D, a conductive layer 26 intended to form a second electrode of the capacitor is homogeneously deposited over the entire layer 24 to fill pores P and the top of opening W. Layer 26 for example is a bilayer formed of a thin bonding layer 27 deposited by an ALD method and a thick layer 28 deposited by electrolytic method. Bonding layer 27 for example is a TaN, Ru, W, Ti, TiN, Ta, or Cu layer or a multiple-layer of these conductors deposited with a thickness lower than 5 nm, preferably at most 3 nm. Thick layer 28 is for example a copper layer deposited to fill opening W.

Figure 2F:
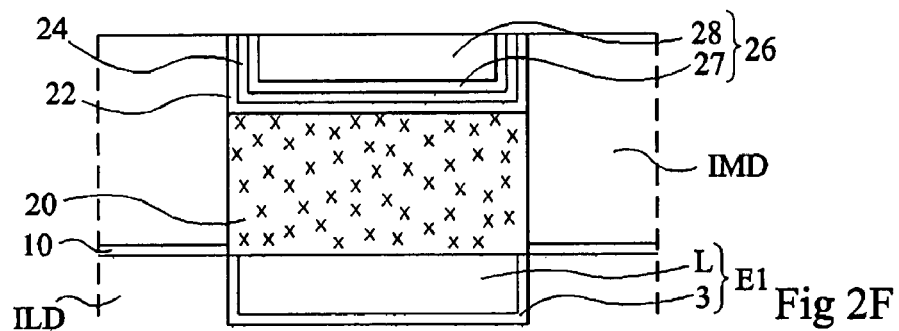

The method carries on, as illustrated in FIG. 2F, with the removal of mask M and of the portions of layers 22, 24, and 26 superposed to mask M to only leave in place layers 22, 24, and 26 in opening W of FIG. 2B. For example, after the deposition of layer 26, a chem-mech polishing CMP, stopping on dielectric IMD, is performed.

Then, the semiconductor circuit manufacturing carries on with the implementation of the currents steps, for example, of forming of additional interconnect metallization levels above the IMD level, the passivating of the structure, the sawing of chips, and their packaging.

It should be noted that the capacitor according to the present invention is formed in an insulating porous material 20 that does not form an active part of the capacitor. The layer of insulating porous material 20 constitutes only a passive carrier wherein the different parts of the capacitor, that is both electrodes separated with the interelectrode insulator, are to be formed.

The capacitor according to the present invention formed in insulating porous material 20 exhibits a considerably increased surface area S. Indeed, the capacitor surface develops in all the interconnected pores P. The inventors have calculated that for an SiOCH layer obtained by doping with methyl silicon oxide, of a 140×140-μm$^2$ surface area, of a porosity on the order of 30% having pores with a 30-nm diameter and a 25-nm length, the gain in surface area with respect to the planar capacitor of FIG. 1 ranges between 500 and 600%.

To such an increase in the surface area corresponds a corresponding increase in the capacitor capacitance (C=∈S/e).

Such an increase in capacitance enables avoiding the use of insulators of complex oxide or ceramic type as is typically done.

Given the significant value of the capacitance increase, the implementation constraint of the methods of ALD deposition of metal layers 22 and 26 and insulating layer 24 is negligible.

Further, the method according to the present invention is compatible with a reduction in the dimensions of semiconductor circuits and in particular of the surface available in level IMD to form the capacitor.

It should be noted that the thickness of layer 20 is selected to leave exposed a high portion of window W, sufficiently large to be able to form second electrode 26 and implement the leveling described in relation with FIG. 2F.

Of course, the present invention is likely to have various alterations, modifications, and improvements which will readily occur to those skilled in the art. In particular, those skilled in the art will understand that it has been considered that first electrode 22 contacts an underlying metallization L as a non-limiting example only. As is already the case for known capacitors, the first electrode may contact a neighboring metallization line formed in the same dielectric IMD or in a higher level. In this last case, layer 22 is only partially removed from the upper surface of dielectric IMD.

Further, it will be within the abilities of those skilled in the art to bring any material and thickness modifications necessary in a given technological process. Thus, it will be within the abilities of those skilled in the art to adapt interelectrode insulator 24 to the previously-described deposition constraints. It will also be within the abilities of those skilled in the art to adapt passivation layer 10 to the structure of line L. In particular, it has been previously assumed that passivation layer 10 is an insulating layer extending on line L and dielectric ILD. However, layer 10 may be limited to the surface of line L and be conductive.

Similarly, it will be within the abilities of those skilled in the art to adapt the conductive materials used to the technological process used. In particular, those skilled in the art will adapt the material of first electrode 22 to the insulating porous material 20 used. Those skilled in the art will also adapt the selection of the conductive material(s) forming second electrode 26 to the constraint of local conformal deposition in pores P and of filling of the top of opening W.

Further, the direct deposition of an insulating porous material has been described. A non-porous material may however be deposited or grown, which will then be made porous.

Generally, although the present invention has been described in the context of a silicon process, it applies to any semiconductor circuit manufacturing process.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A capacitor, comprising:
   a dielectric substrate;
   a barrier layer disposed on the dielectric substrate;
   a conductive material disposed on the barrier layer;
   an insulating porous material disposed on the surface of the conductive material, the porous material comprising a plurality of pores;
   a first conductive layer disposed in the plurality of pores and on the insulating porous material;
   an insulating layer disposed in the plurality of pores on the first conductive layer; and
   a second conductive layer disposed in the plurality of pores on the insulating layer.

2. The capacitor of claim 1, wherein the dielectric substrate comprises a recess.

3. The capacitor of claim 1, wherein the capacitor comprises a passivation layer disposed on a non-recessed portion of the dielectric.

4. The capacitor of claim 3, wherein the capacitor comprises a dielectric layer disposed on the passivation layer.

5. The capacitor of claim 1, wherein the insulating porous material exhibits a homogeneous porosity ranging between approximately 20% and 40%.

6. The capacitor of claim 1, wherein the insulating porous material exhibits openings spaced a distance apart between approximately 20 nm and 30 nm.

7. A capacitor, comprising:
   a conductive material;
   an insulating porous material disposed on a surface of the conductive material, the insulating porous material comprising a plurality of pores;

a first conductive layer disposed in the plurality of pores and on the insulating porous material;

an insulating layer disposed in the plurality of pores on the first conductive layer; and a second conductive layer disposed in the plurality of pores on the insulating layer.

8. The capacitor of claim 7, further comprising a barrier layer, the conductive material disposed on the barrier layer.

9. The capacitor of claim 8, further comprising a dielectric substrate, the barrier layer disposed on the dielectric substrate.

10. The capacitor of claim 7, wherein the insulating porous material exhibits a homogeneous porosity ranging between approximately 20% and 40%.

11. The capacitor of claim 7, wherein the insulating porous material exhibits openings spaced a distance apart between approximately 20 nm and 30 nm.

12. A capacitor, comprising:

an insulating porous material comprising a plurality of pores;

a first conductive layer disposed in the plurality of pores and on the insulating porous material;

an insulating layer disposed in the plurality of pores on the first conductive layer; and a second conductive layer disposed in the plurality of pores on the insulating layer.

13. The capacitor of claim 12, further comprising a conductive substrate element, the insulating porous material disposed on a surface of the conductive substrate element.

14. The capacitor of claim 13, wherein the insulating porous material exhibits a homogeneous porosity ranging between approximately 20% and 40%.

15. The capacitor of claim 13, wherein the insulating porous material exhibits openings spaced a distance apart between approximately 20 nm and 30 nm.

* * * * *

UNITED STATES PATENT AND TRADEMARK OFFICE
CERTIFICATE OF CORRECTION

| | | |
|---|---|---|
| PATENT NO. | : 7,630,191 B2 | Page 1 of 1 |
| APPLICATION NO. | : 11/706059 | |
| DATED | : December 8, 2009 | |
| INVENTOR(S) | : Joaquin Torres et al. | |

It is certified that error appears in the above-identified patent and that said Letters Patent is hereby corrected as shown below:

Col. 2, line 41 should read:
The present invention aims at providing a capacitor structure Signed and Sealed this Nineteenth Day of January, 2010

David J. Kappos
*Director of the United States Patent and Trademark Office*